US010964373B2

(12) United States Patent
Perrin et al.

(10) Patent No.: US 10,964,373 B2
(45) Date of Patent: Mar. 30, 2021

(54) MEMORY CELLS WITH CAPACITIVE LOGIC BASED ON ELECTROMECHANICALLY CONTROLLED VARIABLE-CAPACITANCE CAPACITORS

(71) Applicant: Commissariat à l'Énergie Atomique et aux Énergies Alternatives, Paris (FR)

(72) Inventors: Yann Perrin, Grenoble (FR); Hervé Fanet, Revel (FR); Ayrat Galisultanov, Grenoble (FR); Gaël Pillonnet, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/567,927

(22) Filed: Sep. 11, 2019

(65) Prior Publication Data

US 2020/0082867 A1 Mar. 12, 2020

(30) Foreign Application Priority Data

Sep. 11, 2018 (FR) ...................................... 1858125

(51) Int. Cl.
*G11C 23/00* (2006.01)
*G11C 11/23* (2006.01)
*G11C 11/24* (2006.01)
*G11C 11/50* (2006.01)
*H01P 7/08* (2006.01)
*H01G 5/40* (2006.01)

(52) U.S. Cl.
CPC .............. *G11C 11/23* (2013.01); *G11C 11/24* (2013.01); *G11C 11/50* (2013.01); *G11C 23/00* (2013.01); *H01G 5/40* (2013.01); *H01P 7/082* (2013.01)

(58) Field of Classification Search
CPC .......... G11C 11/23; G11C 11/24; G11C 23/00
See application file for complete search history.

(56) References Cited

U.S. PATENT DOCUMENTS 4,979,149 A * 12/1990 Popovic ............... H01H 1/0036
365/244
9,257,981 B2 * 2/2016 Fanet ................. H03K 19/0019
(Continued)

FOREIGN PATENT DOCUMENTS

EP 0986077 A2 3/2000
EP 3182590 A1 6/2017

OTHER PUBLICATIONS

Preliminary Search Report for French Application No. 1858125, dated Jun. 20, 2019.
(Continued)

*Primary Examiner* — Mushfique Siddique
(74) *Attorney, Agent, or Firm* — Wolf, Greenfield & Sacks, P.C.

(57) ABSTRACT

A memory cell in capacitive logic, including a bistable system including a fixed element and a mobile element capable of taking one or the other of two stable positions with respect to the fixed element; a read device including a variable-capacitance capacitor including a first fixed electrode and a second mobile electrode rigidly fixed to the mobile element; and an electrically controllable write device for placing the mobile element in one or the other of its two stable positions.

9 Claims, 5 Drawing Sheets

(A)

(B)

(56) References Cited

U.S. PATENT DOCUMENTS

| | | | | |
|---|---|---|---|---|
| 10,593,485 B2* | 3/2020 | Pillonnet | ............... | H01L 23/645 |
| 2005/0055170 A1* | 3/2005 | Gibson | ................. | B82Y 10/00 |
| | | | | 702/65 |
| 2017/0179954 A1* | 6/2017 | Fanet | ................. | H03K 19/0019 |
| 2018/0366272 A1* | 12/2018 | Pillonnet | .............. | H01G 5/0136 |

OTHER PUBLICATIONS

Maroufi et al., MEMS for Nanopositioning: Design and Applications. Journal of Microelectromechanical Systems. IEEE Service Center. 2017;26(3):469-500.

Galisultanov et al., Contactless four-terminal MEMS variable capacitor for capacitive abiabatic logic. Smart Materials and Structures. IOP Publishing. 2018;27(8):1-10.

Du et al., A Micromachined Tunable Bistable Mechanism. Journal of Microelectromechanical Systems. IEEE Service Center. 2016;25(4):708-15.

FR1858125, Jun. 20, 2019, Preliminary Search Report.

* cited by examiner

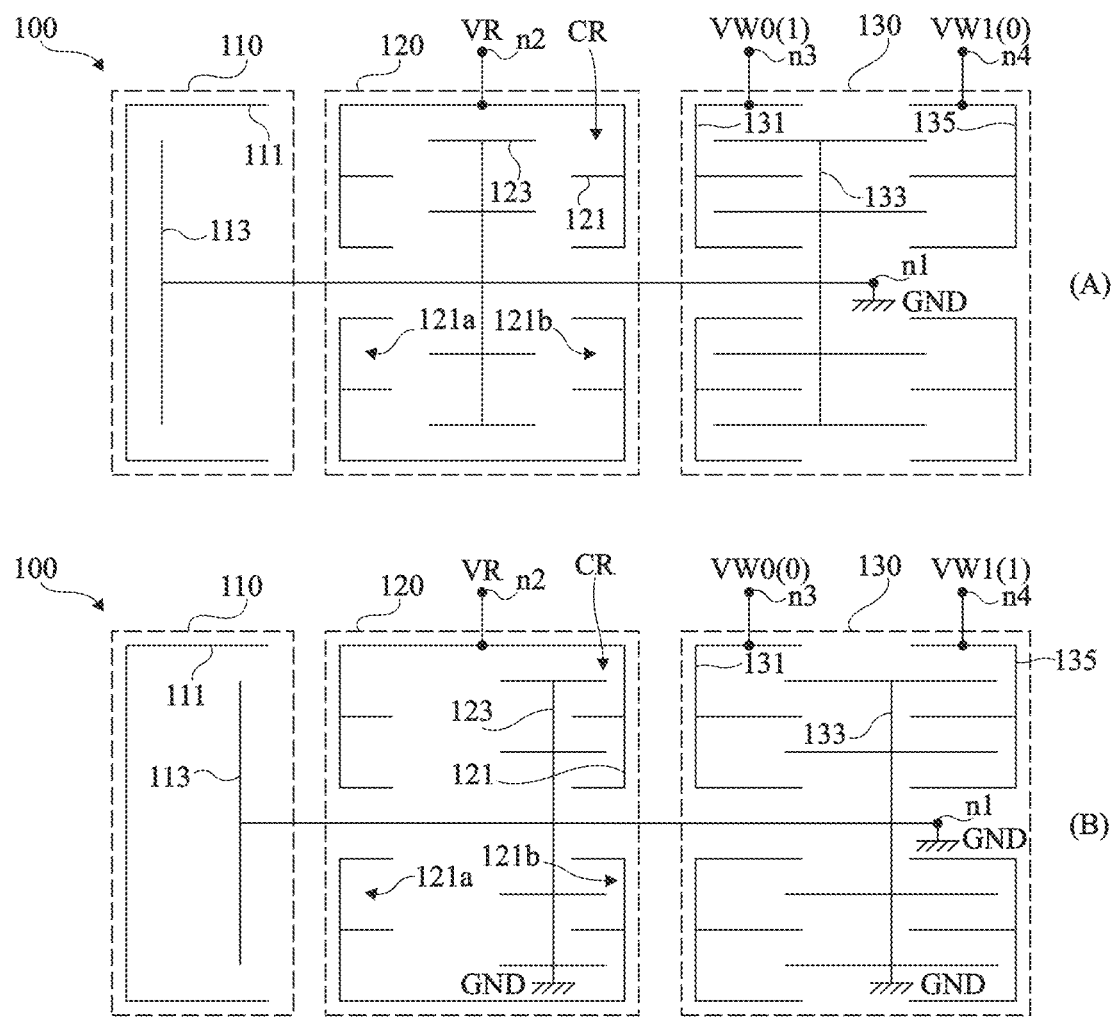
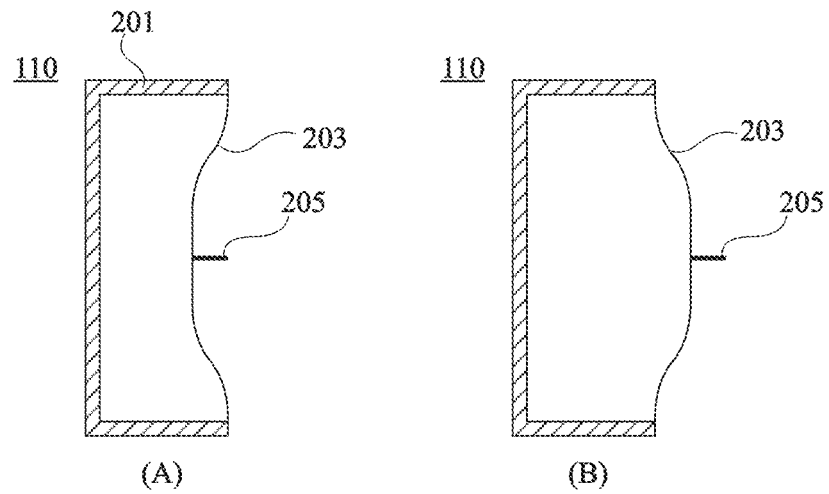
Fig 1
Fig 2

MEMORY CELLS WITH CAPACITIVE LOGIC BASED ON ELECTROMECHANICALLY CONTROLLED VARIABLE-CAPACITANCE CAPACITORS

CROSS-REFERENCE OF RELATED APPLICATIONS

This application claims priority to French patent application number 1857125, the content of which is hereby incorporated by reference in its entirety.

TECHNICAL FIELD

The present disclosure generally relates to the field of logic circuits realised on the basis of variable-capacitance capacitors, also called capacitive logic circuits, and is more specifically directed to the realisation of a memory cell in a capacitive logic circuit.

BACKGROUND ART

The applicant has already proposed, in particular in the patent application EP3182590 (B14590-DD16568), in the French patent application no. 17/55419 filed Jun. 15, 2017 (B15834-DD17806), and in the French patent application no. 17/57060 filed Jul. 25, 2017 (B16125-DD17999), example embodiments of elementary logic cells based on electromechanically controlled variable-capacitance capacitors.

The use of electromechanically controlled variable-capacitance capacitors for implementing logic functions makes it possible to achieve logic circuits with a very low electrical power consumption. In particular, it makes it possible to eliminate leakage currents, which are a limiting factor of classic logic circuits, and in particular of logic circuits realised based on transistors.

The above-mentioned patent applications describe more specifically the realisation of inverting and non-inverting buffer cells, as well as a certain number of basic combinatorial logic cells, based on electromechanically controlled variable-capacitance capacitors.

In order to be able to realise more complex circuits, however, it would be desirable to be able to have a memory cell in capacitive logic. The present application relates to the realisation of such a memory cell.

SUMMARY OF INVENTION

Thus, one embodiment provides a memory cell in capacitive logic, comprising:
a bistable system comprising a fixed element and a mobile element capable of taking one or the other of two stable positions with respect to the fixed element;
a read device comprising a variable-capacitance capacitor comprising a first fixed electrode and a second mobile electrode rigidly fixed to the mobile element; and
an electrically controllable write device for placing the mobile element in one or the other of its two stable positions.

According to an embodiment, the write device is an electrostatic device comprising a third fixed electrode, a fourth fixed electrode, and a fifth mobile electrode rigidly fixed to the mobile element, the fifth electrode being disposed between the third and fourth electrodes.

According to an embodiment, the third, fourth and fifth electrodes have the form of inter-engaged combs.

According to an embodiment, the third, fourth and fifth electrodes have the form of flat plates that are parallel to one another.

According to an embodiment, the first and second electrodes have the form of inter-engaged combs.

According to an embodiment, the first and second electrodes have the form of flat plates that are parallel to each other.

According to an embodiment, the bistable system is a mechanical system, comprising a curved flexure beam coupled by its ends to a fixed frame.

According to an embodiment, the ends of the beam are fixed directly to the fixed frame.

According to an embodiment, the ends of the beam are coupled to the fixed frame by way of springs, the bistable system further comprising an electrostatic actuating device adapted to actuate the springs so as to move the ends of the beam further away from each other or closer together.

According to an embodiment, the bistable system is an electrostatic system comprising:
a fixed electrode and a mobile electrode, the fixed electrode comprising two conductive parts electrically connected to each other and disposed on either side of the mobile electrode;
a return spring for returning the mobile electrode to a rest position; and
a voltage application circuit for applying a direct bias voltage between the fixed electrode and the mobile electrode.

According to an embodiment, the fixed electrode and the mobile electrode of the bistable system have the form of inter-engaged combs.

According to an embodiment, the fixed electrode and the mobile electrode of the bistable system have the form of flat conductive plates that are parallel to each other.

According to an embodiment, the bistable system is an electrodynamic system comprising:
a fixed conductive coil and a mobile element made of a ferromagnetic material disposed inside the coil;
a return spring for returning the mobile element made of a ferromagnetic material to a rest position; and
a current application circuit for applying a direct bias current between first and second ends of the coil.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 1 illustrates in a schematic manner an example of a capacitive memory cell according to an embodiment;

FIG. 2 illustrates schematically an example embodiment of a bistable system of a capacitive memory cell according to an embodiment;

DESCRIPTION OF EMBODIMENTS

Figure 3:
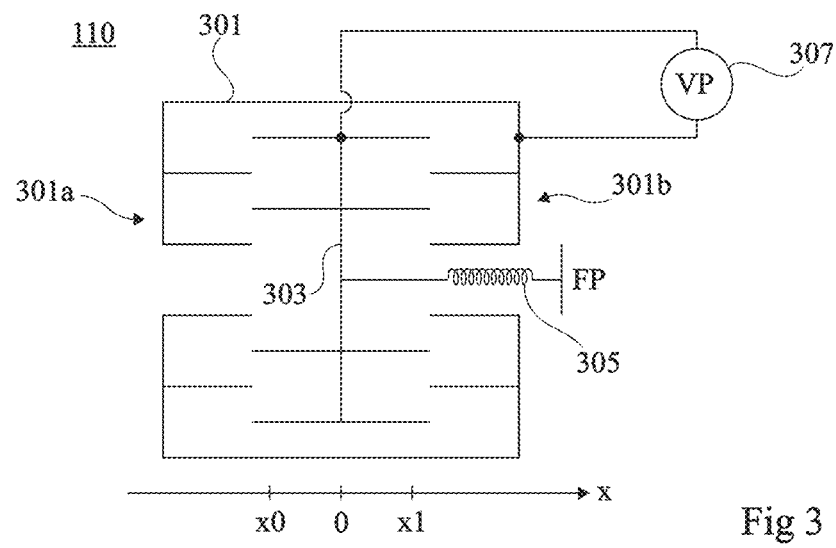
FIG. 3 illustrates schematically a further example embodiment of a bistable system of a capacitive memory cell according to an embodiment.

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the realisation of the various elementary capacitive logic cells capable of being used, in combination with the described memory cells, in a capacitive logic circuit, has not been described in detail, the realisation of these cells being within the capabilities of those skilled in the art, in particular in view of the aforementioned patent applications filed by the applicant.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, it being understood that, in practice, the described devices can have a different orientation.

Unless specified otherwise, the expressions "around", "approximately", "substantially" and "in the order of" signify within 10%, and preferably within 5%.

In the present disclosure, conductive plate is understood to mean a plate made of a material suitable for conducting electrical charges, this material potentially being a conductive material, for example a metal, or a semiconducting material, for example silicon.

In the examples described below, the input and/or output logic signals of a cell preferably correspond to periodic variable voltages, the amplitude of which determines the value, high or low, of the logic signal. One thus speaks of an impulse logic or dynamic logic inasmuch as the states of the input and/or output logic signals are only available during a fraction of the period of a clock signal formed by the power supply voltage of the cell. Preferably, the periodic variable voltages defining the input and/or output logic signals of the cells are progressive variation voltages, for example trapezoidal voltages, which makes it possible to realise cells with an adiabatic or a virtually adiabatic operation. Alternatively, the input and/or output logic signals of the cells correspond to direct voltages the level of which determines the value, high or low, of the logic signal. One thus speaks of static logic.

Unless otherwise specified, a logic signal is understood to mean a signal that can only have two states, a high state (logic 1), which corresponds, for example, to a voltage amplitude or level close to the amplitude or level of the power supply voltage of the cell, for example comprised between 3 and 15 volts, or a low state (logic 0), which corresponds, for example, to a voltage amplitude or level close to 0 V, for example less than 2 volts.

FIG. 1 is a sectional view schematically illustrating an example of a capacitive memory cell 100 according to an embodiment. FIG. 1 comprises more specifically two views (A) and (B) of the memory cell 100. The view (A), the top part of FIG. 1, corresponds to the configuration of the cell during a phase of saving a first logic state, for example a logic 0, and the view (B), the bottom part of FIG. 1, corresponds to the configuration of the cell during a phase of saving a second logic state, for example a logic 1.

The memory cell 100 of FIG. 1 comprises a bistable system 110 comprising a fixed element 111 and a mobile element 113. By bistable system it is understood here that the mobile element 113 has only two positions of stable equilibrium with respect to the fixed element 113. Example embodiments of the bistable system 110 will be described in greater detail in relation to FIGS. 2 to 7.

The memory cell 100 of FIG. 1 further comprises a read device 120 comprising a variable-capacitance capacitor CR comprising a fixed electrode 121 and a mobile electrode 123. The fixed electrode 121 is rigidly fixed to the fixed element 111 of the bistable system 110, and the mobile electrode 123 is rigidly fixed to the mobile element 113 of the bistable system 110. The capacitance of the read capacitor CR is defined by the relative position of the mobile electrode 123 with respect to the fixed electrode 121. Inasmuch as the mobile element 113 can only take one or the other of two stable positions with respect to the fixed element 111, the capacitance of the capacitor CR can only have one or the other of two stable values: a low value CR_LOW when the mobile electrode 123 and the fixed electrode 121 of the capacitor CR are relatively far away from each other, as depicted by the view (A) of FIG. 1, and a high value CR_HIGH when the mobile electrode 123 and the fixed electrode 121 of the capacitor CR are relatively close to each other, as depicted by the view (B) of FIG. 1.

The memory cell 100 of FIG. 1 additionally comprises an actuating device or write device 130, which is electrically controllable in order to make the mobile element 113 of the bistable system 110 move from either of its two positions of equilibrium to the other, and thus the capacitance of the capacitor CR from its high value CR_HIGH to its low value CR_LOW or the other way around. In the example of FIG. 1, the device 130 is an electrostatic actuating device comprising two fixed electrodes 131 and 135 disposed on either side of a mobile electrode 133. The fixed electrodes 131 and 135 are rigidly fixed to the fixed element 111 of the bistable system 110 and to the fixed electrode 121 of the read device 120, and the mobile electrode 133 is rigidly fixed to the mobile element 113 of the bistable system 110 and to the mobile electrode 123 of the read device 120.

In the example of FIG. 1, the three fixed electrodes 121, 131 and 135 of the memory cell are electrically isolated from one another. In addition, the mobile electrodes 123 and 133 are electrically isolated from the fixed electrodes 121, 131 and 135. The mobile electrodes 123 and 133 can be electrically isolated from each other, or electrically connected to each other. In the example of FIG. 1, the mobile electrodes 123 and 133 are connected to a same application node n1 for applying a reference potential GND, for example ground. The fixed electrodes 121, 131 and 135 are, for their part, respectively connected to an application node n2 for applying a read voltage VR, to an application node n3 for applying a first write voltage VW0 and to an application node n4 for applying a second write voltage VW1. In this example, the read voltage VR and write voltages VW0 and VW1 are referenced with respect to the potential GND.

The operation of the memory cell 100 of FIG. 1 will now be described.

In order to write a logic 0 in the cell 100, the voltages VW0 and VW1 are respectively placed in a high and a low state. In other words, a relatively high voltage is applied between the fixed electrode 131 and the mobile electrode 133 of the actuating device 130, and a relatively low voltage is applied between the fixed electrode 135 and the mobile electrode 133 of the device 130. Thus, an electrostatic force of attraction is exerted by the fixed electrode 131 on the mobile electrode 133, causing a movement in a first direction (toward the left in the example of FIG. 1) of the whole of the mobile unit formed by the electrodes 133 and 123 and by the element 113. This leads to the mobile element 113 of the bistable system 110 being placed in a first of its two positions of stable equilibrium, in which the mobile electrode 123 of the read device 120 is relatively far away from the fixed electrode 121 of the device 120, as depicted by the view (A) of FIG. 1.

In order to write a logic 1 in the cell, the voltages VW0 and VW1 are respectively placed in a low and in a high state. In other words, a relatively high voltage is applied between the fixed electrode 135 and the mobile electrode 133 of the actuating device 130, and a relatively low voltage is applied between the fixed electrode 131 and the mobile electrode 133 of the device 130. Thus, an electrostatic force of attraction is exerted by the fixed electrode 135 on the mobile electrode 133, causing a movement in a second direction opposite the first direction (toward the right in the example of FIG. 1) of the whole of the mobile unit formed by the electrodes 133 and 123 and by the element 113. This causes the mobile element 113 of the bistable system 110 to be placed in its second position of stable equilibrium, in which the mobile electrode 123 of the read device 120 is relatively close to the fixed electrode 121 of the device 120, as depicted by the view (B) of FIG. 1.

Outside the write phases, the voltages VW0 and VW1 are, for example, both maintained in a same state, for example a low state, so that no significant electrostatic force (i.e. sufficient to change the state of the bistable system 110) is exerted by the fixed electrodes 131 and 135 on the mobile electrode 133 of the actuating device 130. Thus, the bistable system 110 retains the stored information until the next write operation.

The voltages VW0 and VW1 applied on the fixed electrodes 131 and 135 of the actuating device 130 correspond, for example, to logic signals provided by other capacitive logic cells (not shown in detail here) of a logic circuit, for example logic cells of the type described in the aforementioned patent applications filed by the applicant. In particular, the voltages VW0 and VW1 can be direct voltages in the case of a circuit realised in static-capacitive logic, or periodic variable voltages in the case of a circuit realised in dynamic capacitive logic.

The high or low value of the capacitance of the capacitor CR codes the state of the logic value stored in the memory cell. The logic value stored in the cell can be read by any read circuit adapted to provide an output logic signal the state of which depends on the value of the capacitance of the capacitor CR. Examples (non-limiting) of read circuits will be described below in relation to FIGS. 9 and 10.

Preferably, the arrangement of the fixed electrode 121 and mobile electrode 123 of the read device is such that:

when a logic 1 is saved in the cell, i.e. when the capacitance of the capacitor CR is at its high value CR_HIGH, the electrostatic force exerted by the fixed electrode 121 on the mobile electrode 123 due to the application of the read voltage VR is in the same direction as the electrostatic force exerted by the fixed electrode 135 of the actuating device 130 on the mobile electrode 133 of the device 130 during an operation of writing a logic 1 in the cell (i.e. a force of attraction toward the right in the example of FIG. 1); and when a logic 0 is saved in the cell, i.e. when the capacitance of the capacitor CR is at its low value CR_LOW, the electrostatic force exerted by the fixed electrode 121 on the mobile electrode 123 due to the application of the read voltage VR is less than the force necessary in order to make the mobile element 113 of the bistable system 110 change its position of equilibrium.

By this means, it is possible to prevent any undesirable change in the state of the memory cell as a result of the read voltage VR.

In the example of FIG. 1, the electrodes 131, 133 and 135 of the actuating device 130 are electrodes in the form of inter-engaged combs, also called comb-drive electrodes. More specifically, in the example of FIG. 1, the electrodes 131 and 135 each have, as a cross section, the form of a simple comb, i.e. a comb exhibiting a longitudinal bar and teeth perpendicular to the longitudinal bar extending solely from one side of the longitudinal bar. The mobile electrode 133, for its part, has the form of a double comb, i.e. a comb exhibiting a longitudinal bar and teeth perpendicular to the longitudinal bar extending from both sides of the longitudinal bar. In a perspective view (not illustrated), in each electrode, the teeth of the comb correspond to conductive plates that are substantially flat and parallel to one another, and the bar of the comb corresponds to a conductive plate that is substantially flat and orthogonal to the teeth of the comb. In this example, the longitudinal bars of the combs 131, 133 and 135 are substantially parallel to one another. More specifically, in the orientation of FIG. 1, the longitudinal bars of the combs 131, 133 and 135 are substantially vertical and the teeth of the combs 131, 133 and 135 are substantially horizontal. The fixed combs 131 and 135 are placed across from each other, i.e. the teeth of the comb 131 are turned toward the teeth of the comb 135, and vice versa. More specifically, in this example, each tooth of the comb 131 is substantially in the same plane as a corresponding tooth of the comb 135. A non-zero distance separates each tooth of the comb 131 from the corresponding tooth of the comb 135. The comb 133 is disposed between the combs 131 and 135, so that, on one side (on the left side in the orientation of FIG. 1) of the longitudinal bar of the comb 133, each tooth of the comb 133 is disposed in an intermediary plane between two adjacent teeth of the comb 131, for example substantially equidistant from the two adjacent teeth of the comb 131, and so that, on the other side (on the right side in the orientation of FIG. 1) of the longitudinal bar of the comb 133, each tooth of the comb 133 is disposed in an intermediary plane between two adjacent teeth of the comb 135, for example substantially equidistant from the two adjacent teeth of the comb 135. The electrode 133 is adapted to move in accordance with a sole degree of freedom of movement along a horizontal axis between the electrodes 131 and 135.

During an operation of writing a logic 0 in the memory, a high-level voltage VW0 is applied on the electrode 131. The teeth of the comb 131 thus exert an electrostatic force on the left teeth of the comb 133, causing a horizontal movement toward the left of the comb 133. During an operation of writing a logic 1 in the memory, a high-level voltage VW1 is applied on the electrode 135. The teeth of the comb 135 thus exert an electrostatic force on the right teeth of the comb 133, causing a horizontal movement toward the right of the comb 133.

In the example of FIG. 1, the electrodes 121 and 123 of the read device 120 also have the form of inter-engaged combs. More specifically, in the example of FIG. 1, the electrode 121 comprises two simple interconnected combs 121a and 121b, disposed across from one another according to an arrangement similar to that of the combs 131 and 135 of the actuating device 130. The electrode 123, for its part, has the form of a double comb disposed between the combs 121a and 121b, according to an arrangement with respect to the combs 121a and 121b that is similar to that of the electrode 133 with respect to the combs 131 and 135. The electrode 123 is adapted to move in accordance with a sole degree of freedom of movement along a horizontal axis between the combs 121a and 121b. In this example, the combs 121a, 121b and 123 are disposed so that:

when a logic 0 is saved in the cell, the comb 123 is substantially equidistant from the combs 121a and 121b; and when a logic 1 is saved in the cell, the comb 123 is closer to the fixed left comb 121b than to the fixed right comb 121a.

More specifically, in the illustrated example, the combs 121a, 121b and 123 are disposed so that:

when a logic 0 is saved in the cell, the combs 121a and 123 on one side, and 121b and 123 on the other do not engage one another, so that a relatively low-capacitance value CR_LOW results; and when a logic 1 is saved in the cell, the combs 121b and 123 engage so that a relatively high-capacitance value CR_HIGH results.

Thus, when a logic 0 is saved in the cell, the electrostatic force exerted on the comb 123 by the comb 121b as a result of the read voltage VR is compensated by the electrostatic force exerted on the comb 123 by the comb 121a. The resulting force is thus substantially zero. When a logic 1 is saved in the cell, the electrostatic force exerted by the comb 121b on the comb 123 is greater than the electrostatic force exerted by the comb 121a on the comb 123. The resulting force is thus in the same direction as the electrostatic force exerted by the fixed electrode 135 of the actuating device 130 on the mobile electrode 133 of the device 130 during an operation of writing a logic 1 in the cell.

FIG. 2 illustrates schematically an example embodiment of the bistable system 110 of a capacitive memory cell of the type described in relation to FIG. 1. FIG. 2 comprises more specifically two views (A) and (B) of the bistable system 110. The view (A), the left part of FIG. 2, illustrates a first position of stable equilibrium of the system, corresponding, for example, to the saving of a logic 0 in the cell, and the view (B), the right part of FIG. 2, illustrates a second position of stable equilibrium of the system, corresponding, for example, to the saving of a logic 1 in the cell.

The bistable system of FIG. 2 is a purely mechanical system, comprising a fixed frame 201 (shown as hatched lines in the figure), and a flexure bar or beam 203 fixed by its ends to the frame 201. The beam 203 has a suspended central part, capable of moving freely with respect to the frame. The system of FIG. 2 additionally comprises an actuating bar or pin 205 fixed to the central part of the beam 203. In a first position of stable equilibrium, corresponding, for example, to the view (A) of FIG. 2, the beam 203 exhibits, in its longitudinal direction, a curved shape, for example a convex shape. The longitudinal curvature of the beam can result from a compression applied between its ends during its fixation to the frame 201, or can correspond to the natural shape of the beam. When a force orthogonal to the beam 203 is applied on the actuating bar 205, in the direction of the centre of the arc of curvature of the beam, the beam 203 can move, by buckling, into a second position of stable equilibrium, corresponding in this example to the view (B) of FIG. 2, in which the beam exhibits, in its longitudinal direction, a shape that is curved according to a direction of curvature opposite that of the first position of stable equilibrium.

In this example, the frame 201 corresponds to the fixed element 111 (FIG. 1) of the bistable system 110, and the actuating bar 205 corresponds to the mobile element 113 (FIG. 1) of the system 110. The actuating bar 205 is fixed to the mobile electrodes 123 and 133 of the memory cell so that, during a write operation, the movement of the mobile electrode 133 of the actuating device 130 as a result of the write voltages VW0 and/or VW1 causes a switching of the beam 203 from one of its two positions of stable equilibrium to the other and a switching of the capacitance of the capacitor CR from one of its values high CR_HIGH and low CR_LOW to the other.

An advantage of the system of FIG. 2 is that it makes it possible to realise a non-volatile memory inasmuch as the bistable system 110 is purely mechanical and thus retains the stored information even in the absence of any electrical bias of the memory cell.

A limitation of the system of FIG. 2 results from the fact that the energy barrier 4E separating the two states of stable equilibrium of the system has a fixed value that depends on the geometry of the flexure beam. Moving from one logic state to the other thus dissipates energy at least equal to $2\Delta E$, which prevents a state from being changed in an adiabatic manner.

FIG. 3 illustrates schematically a further example embodiment of the bistable system 110 of a capacitive memory cell of the type described in relation to FIG. 1.

The bistable system of FIG. 3 is an electrostatic system comprising a fixed electrode 301 and a mobile electrode 303. The fixed electrode 301 comprises two conductive parts 301a and 301b rigidly fixed to each other and electrically connected to each other, disposed on either side of the mobile electrode 303. In the example of FIG. 3, the mobile electrode 303 is adapted to move in accordance with a sole degree of freedom of movement along a horizontal axis X. The electrodes 301 and 303 are arranged so that, when the electrode 303 moves along the axis X, the distance between the electrode 303 and the part 301a of the electrode 301 increases and the distance between the electrode 303 and the part 301b of the electrode 301 decreases, or vice versa.

The bistable system 110 of FIG. 3 further comprises a return spring 305 for returning the mobile electrode 303 to a rest position, i.e. a position of stable equilibrium in the absence of an electrical bias of the electrodes 301 and 303. The spring 305 is, for example, a traction or compression spring having a first end fixed to the mobile electrode 303 and a second end fixed to a fixed point FP rigidly fixed to the electrode 301. In the illustrated example, the rest position of the mobile electrode 303 corresponds to the position depicted in FIG. 3, in which the electrode 303 is located equidistant from parts 301a and 301b of the electrode 301. As a variant, the rest position can be a position in which the electrode 303 is closer to the part 301a of the electrode 301 than to the part 301b of the electrode 301, or vice versa.

The bistable system 110 of FIG. 3 further comprises a voltage application circuit 307 for applying a direct bias voltage VP between the electrodes 301 and 303.

Figure 4:
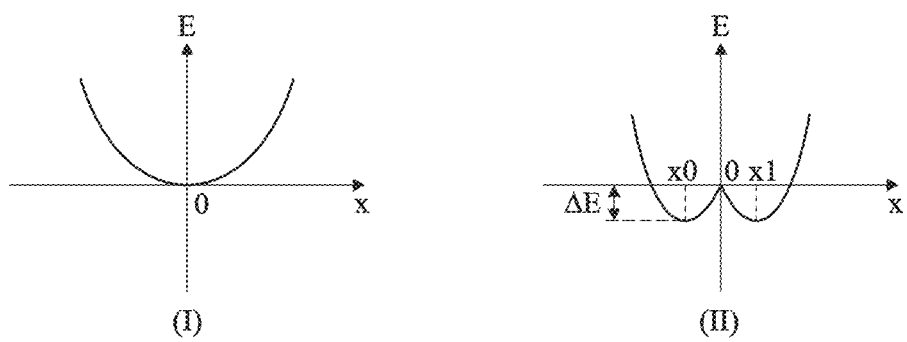
FIG. 4 depicts the operation of the bistable system of FIG. 3.

FIG. 4 depicts the operation of the bistable system 110 of FIG. 3. FIG. 4 comprises more specifically, in the left part of Figure, a first graph (I) depicting the behaviour of the system in the absence of an application of the bias voltage VP between the electrodes 301 and 303, and, in the right part of Figure, a second graph (II) depicting the behaviour of the system when a non-zero bias voltage VP is applied between the electrodes 301 and 303.

x denotes here the position of the electrode 303 along the axis X, the position x=0 corresponding to the rest position of the electrode 303, the positions x>0 corresponding to the positions in which the electrode 303 is closer to the part 301b of the electrode 301 than in the rest position, and the positions x<0 corresponding to the positions in which the electrode 303 is closer to the part 301a of the electrode 301 than in the rest position.

Each of the graphs (I) and (II) depicts more specifically the progression, as a function of the position x of the electrode 303, of the potential energy E of the electrode 303.

When the bias voltage VP is zero, the mobile electrode 303 is subjected solely to an elastic returning force F defined as follows:

$$F = -k \times x \quad \text{[Math 1]}$$

where k designates the stiffness of the spring 305.

The potential energy E of the electrode 303 is purely elastic and is defined as follows:

$$E = \tfrac{1}{2} \times k \times x^2 \quad \text{[Math 2]}$$

The position x=0 is thus the only position of stable equilibrium of the system as depicted by the graph (I) of FIG. 4.

When a non-zero bias voltage VP is applied between the electrodes 301 and 303, an electrostatic energy is added to the elastic energy defined above. The potential energy E of the electrode 303 is thus defined as follows:

$$E = \tfrac{1}{2} \times k \times x^2 - \tfrac{1}{2} \times C \times VP^2 \quad \text{[Math 3]}$$

where C designates the capacitance of the capacitor formed by the electrodes 301 and 303, defined as follows:

$$C = K \times |x| \quad \text{[Math 4]}$$

K designating a constant coefficient depending on the geometry of the electrodes 301 and 303.

The profile of the potential energy E of the electrode 303 in the presence of a non-zero bias voltage is depicted by the graph (II) of FIG. 4. It exhibits two local minima respectively at a position x0<0 and at a position x1>0. These positions correspond to the two positions of stable equilibrium of the bistable system. For instance, the position x=x0 corresponds to the saving of a logic 0 (view (A) of FIG. 1), and the position x=x1 corresponds to the saving of a logic 1 (view (B) of FIG. 1).

In the example of FIG. 3, the electrodes 301 and 303 of the bistable system 110 are electrodes in the form of inter-engaged combs. More specifically, in the example of FIG. 1, the parts 301a and 301b of the electrode 301 each have, as a cross section, the form of a simple comb. The mobile electrode 303, for its part, has the form of a double comb. In this example, the combs 301a, 301b and 303 are disposed according to an arrangement identical or similar to that of the combs 121a, 121b and 123 of FIG. 1. For instance, in the rest position of the system, the structure formed by the electrodes 301a, 301b and 303 is symmetrical with respect to a vertical axis substantially coinciding with the central axis of the longitudinal bar of the comb 303.

In this configuration, in the model with the flat capacitor, the capacitance C between the electrodes 301 and 303 of the system 110 can be expressed as follows:

$$C = \frac{2 \times n \times e \times \varepsilon 0 \times |x|}{g} \quad \text{[Math 5]}$$

where n designates the number of teeth of one half of a comb, e designates the thickness of the conductive plates constituting the teeth of the combs, g designates the distance separating each tooth of the comb 303 from the adjacent teeth of the comb 301a or 301b, and ε0 designates the permittivity of the vacuum.

The two potential energy minima of the electrode 303 are thus obtained at the following positions x0 and x1:

$$\begin{cases} x0 = -\dfrac{n \times e \times \varepsilon 0 \times |x|}{kg} \times VP^2 \\ x1 = +\dfrac{n \times e \times \varepsilon 0 \times |x|}{kg} \times VP^2 \end{cases} \quad \text{[Math 6]}$$

The energy barrier separating the two positions of stable equilibrium of the system 110 is thus defined as follows:

$$\Delta E = \frac{1}{2k} \times \left( \frac{n \times e \times \varepsilon 0}{g} \right)^2 \times VP^4 \quad \text{[Math 7]}$$

More generally, regardless of the geometry of the electrodes 301 and 303, the energy barrier ΔE is an increasing function of the direct bias voltage VP.

In the example of FIG. 3, the fixed electrode 301 corresponds to the fixed element 111 (FIG. 1) of the bistable system 110, and the mobile electrode 303 corresponds to the mobile element 113 (FIG. 1) of the system 110. The mobile electrode 303 is fixed to the mobile electrodes 123 and 133 of the memory cell so that, during a write operation, the movement of the mobile electrode 133 of the actuating device 130 as a result of the write voltages VW0 and/or VW1 causes a switching of the electrode 303 from one of its two positions of stable equilibrium to the other and a switching of the capacitance of the capacitor CR from one of its high CR_HIGH and low CR_LOW values to the other.

Thus, by means of the bistable system of FIG. 3, it is possible to retain information as long as the direct bias voltage VP is maintained. The information is, however, lost when the bias voltage VP is interrupted, which makes the system of FIG. 3 a volatile memory system.

An advantage of the system of FIG. 3 is that the energy barrier ΔE separating the two states of stable equilibrium of the system can be lowered by temporarily reducing (as an absolute value) the direct bias voltage VP during an operation of writing a logic value in the memory cell. This makes it possible to implement an adiabatic or virtually adiabatic modification of a state of the cell.

Figure 5:
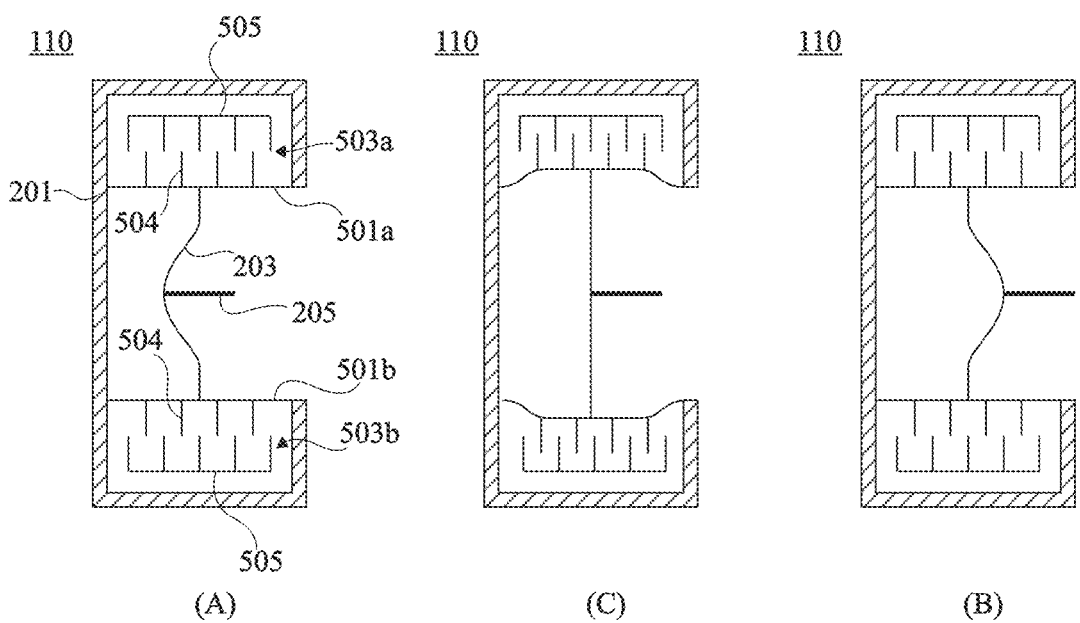
FIG. 5 illustrates schematically a further example embodiment of a bistable system of a capacitive memory cell according to an embodiment.

FIG. 5 illustrates schematically a further example embodiment of the bistable system 110 of a capacitive memory cell of the type described in relation to FIG. 1. FIG. 5 comprises more specifically three views (A), (B) and (C) of the bistable system 110. The view (A), the left part of FIG. 5, illustrates a first position of stable equilibrium of the system, corresponding, for example, to the saving of a logic 0 in the cell, the view (B), the right part of FIG. 5, illustrates a second position of stable equilibrium of the system, corresponding, for example, to the saving of a logic 1 in the cell, and the view (C), the central part of the figure, illustrates a phase of transition between the two positions of stable equilibrium of the system.

The bistable system 110 of FIG. 5 is a mechanical system comprising the same elements as the system of FIG. 2, arranged so as to operate substantially in the same manner as in the system of FIG. 2. The system of FIG. 5 differs from the system of FIG. 2 mainly in that, in the system of FIG. 5, the ends of the flexure beam 203 are not fixed directly to the fixed frame 201, but are coupled to the frame 201 by way of springs, electrostatic actuating means being provided for actuating the springs so as to move the anchoring points of the beam further apart or bring them closer together, and thus modify the value of the energy barrier ΔE separating the two states of stable equilibrium of the flexure beam 203.

In the example of FIG. 5, the system more specifically comprises two leaf springs 501a and 501b which are substantially parallel to each other. Each of the leaf springs 501a and 501b is fixed by its ends to the fixed frame 201. More specifically, each of the leaf springs 501a and 501b is suspended by its ends to the frame 201, a central part of each leaf being free to move with respect to the frame 201 as the result of an elastic deformation of the leaf. The flexure beam 203 has a first end fixed to the central part of the leaf spring 501a and a second end fixed to the central part of the leaf spring 501b. The system of FIG. 5 further comprises an electrostatic actuating device 503a coupled to the leaf spring 501a and an electrostatic actuating device 503b coupled to the leaf spring 501b. Each actuating device comprises a first electrode 504 fixed to the central part of the leaf spring, a second electrode 505 fixed to the frame 201, and a voltage application circuit (not illustrated) for applying a direct bias voltage between the electrodes 504 and 505. In each of the actuating devices 503a and 503b, the electrodes 504 and 505 have, for example, the form of inter-engaged combs. In each of the actuating devices 503a and 503b, the application of a bias voltage between the electrodes 504 and 505 leads to a modification of the relative position of the mobile electrode 504 with respect to the fixed electrode 505, and thus of the distance between the ends of the flexure beam 203. More specifically, in this example, at rest, i.e. in the absence of a bias of the electrodes 504 and 505, the beam 203 exhibits a longitudinal curvature, and the behaviour of the bistable system is substantially identical to that of the system of FIG. 2. This configuration corresponds to the views (A) and (B) of FIG. 5. The application of a non-zero direct bias voltage between the electrodes 504 and 505 causes the two anchoring points of the flexure beam 203 to move away from each other, i.e. a stretching of the beam 203, and thus a decrease in or elimination of the curvature of the beam 203. This configuration corresponds to the view (C) of FIG. 5. Starting from this indeterminate state, a logic value can be written in the cell by breaking the symmetry of the flexure beam 203 by applying an external force by means of the actuating device 130 (FIG. 1), then by lowering the bias voltage applied between the electrodes 504 and 505.

Thus, an advantage of the system of FIG. 5 is that the energy barrier ΔE separating the two states of stable equilibrium of the system can be lowered considerably by applying a bias voltage between the electrodes 504 and 505, which makes it possible to implement an adiabatic or virtually adiabatic modification of a state of the cell, while benefiting from the advantage of the non-volatility of the storage procured by the use of a mechanical bistable system.

Figure 6:
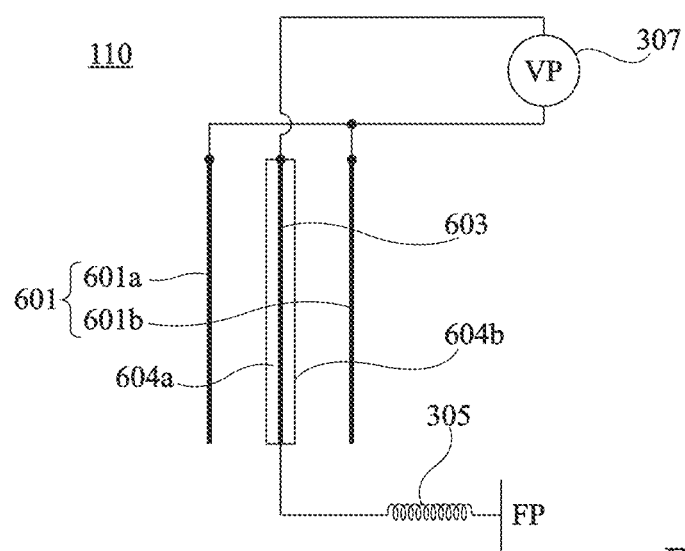
FIG. 6 illustrates schematically a further example embodiment of a bistable system of a capacitive memory cell according to an embodiment.

FIG. 6 illustrates schematically a further example embodiment of the bistable system 110 of a capacitive memory cell of the type described in relation to FIG. 1.

The bistable system of FIG. 6 is an electrostatic system similar to the system of FIG. 3, and differs from the system of FIG. 3 mainly in that, in the system of FIG. 6, the electrostatic actuators in the form of inter-engaged combs of the system of FIG. 3 are replaced by flat electrostatic actuators.

The system of FIG. 6 comprises a fixed electrode 601 and a mobile electrode 603. The fixed electrode 601 comprises two conductive parts 601a and 601b rigidly fixed to each other and electrically connected to each other, disposed on either side of the mobile electrode 603. In the example of FIG. 6, the electrode 603 and the parts 601a and 601b of the electrode 601 are each constituted by a substantially flat conductive plate. The plates 601a, 603 and 601b are substantially parallel to one another. In the example of FIG. 6, the plates 601a, 603 and 601b are substantially vertical. The mobile plate 603 is capable of moving in accordance with a sole degree of freedom of movement along a horizontal axis so as to decrease the distance between the plate 603 and the plate 601a and increase the distance between the plate 603 and the plate 601b, or vice versa. In order to prevent any risk of a short circuit between the electrodes 603 and 601, at least one of the two faces across from the plates 601a and 603 can be covered by an electrically insulating layer, and at least one of the two faces across from the plates 601b and 603 can be covered by an electrically insulating layer. In the illustrated example, the face of the mobile plate 603 turned toward the plate 601a is covered by an electrically insulating layer 604a, and the face of the mobile plate 603 turned toward the plate 601b is covered by an electrically insulating layer 604b.

As in the example of FIG. 3, the bistable system 110 of FIG. 6 comprises a return spring 305 for returning the mobile electrode to a rest position, for example a position equidistant from the conductive plates 601a and 601b of the electrode 601. In addition, as in the example of FIG. 2, the bistable system 110 of FIG. 6 further comprises a voltage application circuit 307 for applying a direct bias voltage VP between the electrodes 601 and 603.

The operation of the system of FIG. 6 is similar to that of the system of FIG. 3, namely in that, when the bias voltage VP is zero, the mobile electrode 603 has a sole position of stable equilibrium that corresponds to its rest position, and, in the presence of a non-zero direct bias voltage VP, the mobile electrode 603 has two positions of stable equilibrium, one closer to the plate 601a than to the plate 601b, and the other closer to the plate 601b than to the plate 601a.

Figure 7:
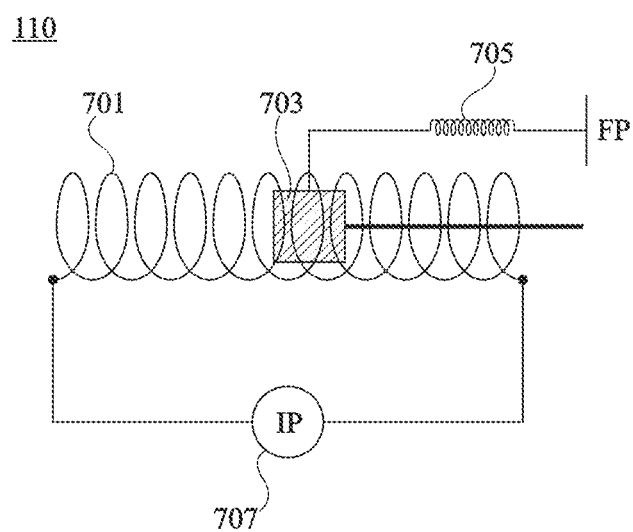
FIG. 7 illustrates schematically a further example embodiment of a bistable system of a capacitive memory cell according to an embodiment.

FIG. 7 illustrates schematically a further example embodiment of the bistable system 110 of a capacitive memory cell of the type described in relation to FIG. 1.

The bistable system of FIG. 7 is an electrodynamic system comprising a fixed conductive coil 701, and a mobile element 703 made of a ferromagnetic material, disposed inside the coil 701. The element 703 is capable of moving inside the coil in accordance with a sole degree of freedom of movement along the axis of the coil 701 (horizontal in the example of FIG. 7).

The bistable system 110 of FIG. 7 further comprises a return spring 705 for returning the mobile element 703 to a rest position, i.e. a position of stable equilibrium in the absence of an electrical bias of the coil 701. The spring 705 is, for example, a traction or compression spring having a first end fixed to the mobile element 703 and a second end fixed to a fixed point FP rigidly fixed to the coil 701. For instance, in the rest position, the mobile element 703 is located substantially in the middle of the coil 701, equidistant from the two ends of the coil.

The bistable system 110 of FIG. 7 further comprises, connected to the ends of the coil 701, a current application circuit 707 for applying a direct bias current IP in the coil.

The operation of the system of FIG. 7 is as follows. When the bias current IP applied to the coil is zero, the mobile element 703 has a sole position of stable equilibrium, corresponding to its rest position. When a non-zero bias current is applied to the coil, this current gives rise to a substantially homogeneous magnetic field in a central part of the coil, and a very heterogeneous magnetic field in the vicinity of the ends of the coil. As a result of this magnetic field, the mobile element 703 is magnetised, and is attracted by the areas with a higher magnetic field gradient, i.e. by the ends of the coil. There are thus two positions of stable equilibrium of the mobile element 703, one closer to the left end of the coil than to its right end, and the other closer to the right end of the coil than to its left end.

In the example of FIG. 7, the coil 701 corresponds to the fixed element 111 (FIG. 1) of the bistable system 110, the element 703 corresponds to the mobile element 113 (FIG. 1) of the system 110. The mobile element 703 is fixed to the mobile electrodes 123 and 133 of the memory cell so that, during a write operation, the movement of the mobile electrode 133 of the actuating device 130 as a result of the write voltages VW0 and/or VW1 causes a switching of the electrode 103 from one of its two positions of stable equilibrium to the other and a switching of the capacitance of the capacitor CR from one of its high CR_HIGH and low CR_LOW values to the other.

By means of the system of FIG. 7, it is possible to retain information as long as the bias current IP is maintained. The information is, however, lost when the current IP is interrupted.

In the system of FIG. 7, the energy barrier ΔE separating the two states of stable equilibrium of the system can be lowered by temporarily reducing (as an absolute value) the direct bias current IP during an operation of writing a logic value in the memory cell, which makes it possible to implement an adiabatic or virtually adiabatic modification of a state of the cell.

Figure 8:
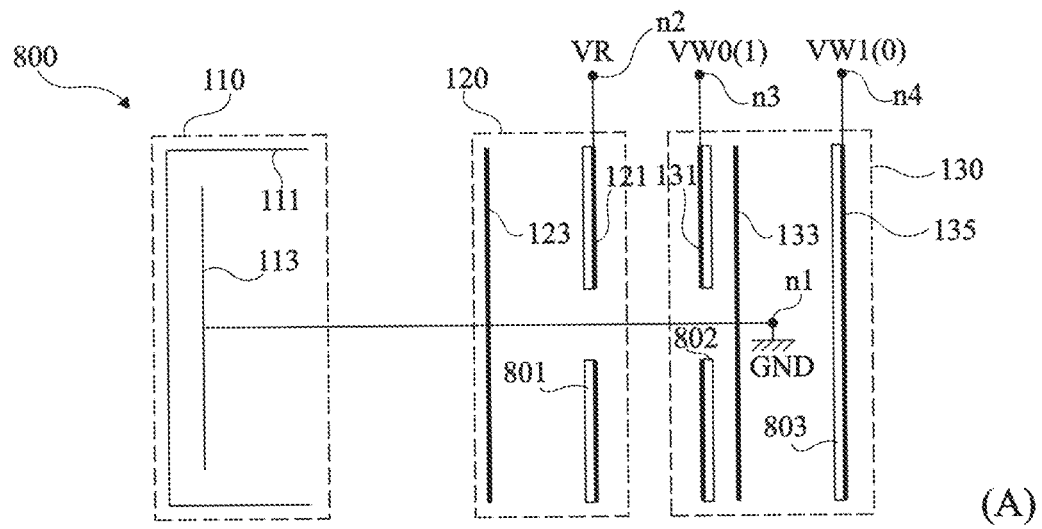
FIG. 8 illustrates schematically a further example of a capacitive memory cell according to an embodiment.
Figure 8:
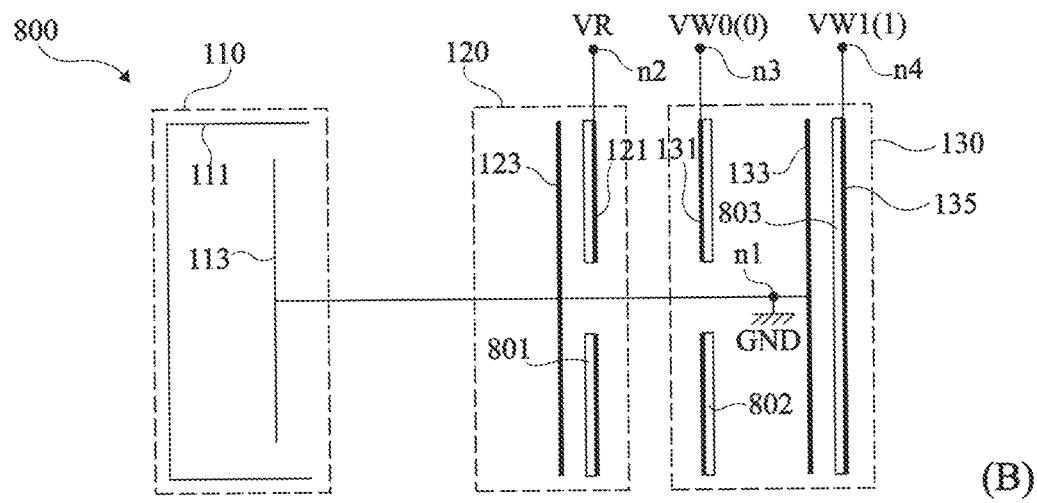

FIG. 8 illustrates schematically a further example of a capacitive memory cell 800 according to an embodiment. FIG. 8 comprises more specifically two views (A) and (B) of the memory cell 800. The view (A), the top part of FIG. 8, corresponds to the configuration of the cell during a phase of saving a first logic state, for example a logic 0, and the view (B), the bottom part of FIG. 8, corresponds to the configuration of the cell during a phase of saving a second logic state, for example a logic 1.

The memory cell 800 of FIG. 8 is similar to the memory cell 100 of FIG. 1, and differs from the cell 100 of FIG. 1 mainly in that, in the cell 800, the electrostatic actuators in the form of inter-engaged combs of the actuating device 130 of the cell 100 are replaced by flat electrostatic actuators. In addition, in the cell 800, the electrodes in the form of inter-engaged combs of the read device 120 of the cell 100 are replaced by flat electrodes.

In the example of FIG. 8, the electrodes 121, 123, 131, 135 and 133 of the read device 120 and of the actuating device 130 are each constituted by a substantially flat conductive plate. The plates 121 and 123 are substantially parallel to each other and across from each other. The plates 131, 133 and 135 are substantially parallel to one another, the plate 133 being disposed between the plates 131 and 135, across from the plates 131 and 135. In the example of FIG. 8, the plates 121, 123, 131, 133 and 135 are substantially vertical, the plates 123 and 133 being mobile in accordance with a sole degree of freedom of movement along a horizontal axis, so as to modify the distance between the plate 121 and the plate 123, and the respective distances between the plate 131 and the plate 133 and between the plate 133 and the plate 135.

In order to prevent any risk of a short circuit between the electrodes, at least one of the two faces across from the plates 121 and 123, at least one of the two faces across from the plates 131 and 133, and at least one of the two faces across from the plates 133 and 135, can be covered by an electrically insulating layer. In the illustrated example, the face of the plate 121 turned toward the plate 123 is covered by an electrically insulating layer 801, the face of the plate 131 turned toward the plate 133 is covered by an electrically insulating layer 802, and the face of the plate 135 turned toward the plate 135 is covered by an electrically insulating layer 803.

Figure 9:
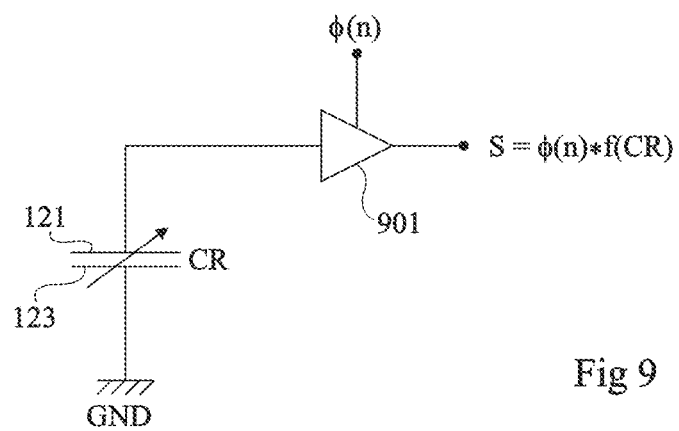
FIG. 9 illustrates an example of a read circuit for reading a capacitive memory cell according to an embodiment.

FIG. 9 depicts schematically an example of a read circuit for reading a capacitive memory cell of the type described above. In this example, the read circuit comprises a capacitive logic cell 901, for example a buffer cell, the input of which is coupled, for example connected, to the electrode 121 of the capacitor CR, and the output of which is coupled, for example connected, to a node for supplying an output signal S of the read circuit. The buffer cell is, for example, a cell of the type described in relation to FIG. 2 or 4 of the French patent application no. FR18/56243 filed Jul. 6, 2018 by the applicant, or in relation to FIG. 2 or 3 of the patent application no. EP 16204534.8 filed Dec. 15, 2016 by the applicant. In this example, the cell 901 is supplied with power by a periodic variable voltage $\phi(n)$, for example a trapezoidal voltage, and the output signal S is a periodic variable voltage in phase with the power supply voltage $\phi(n)$, equal to $\phi(n)*f(CR)$, where $f(CR)$ is a coefficient depending on the value of the capacitance of the capacitor CR.

Figure 10:
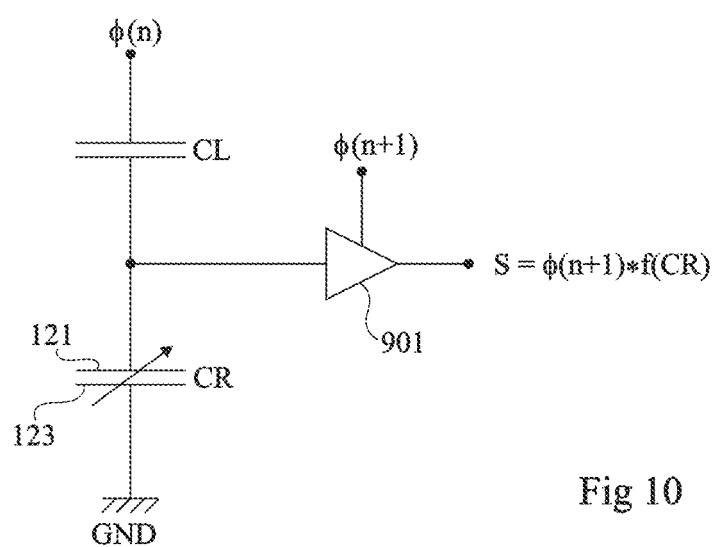
FIG. 10 illustrates schematically a further example of a read circuit for reading a capacitive memory cell according to an embodiment.

FIG. 10 depicts schematically a further example of a read circuit for reading a capacitive memory cell of the type described above. In this example, the read circuit comprises, as in the example of FIG. 9, a capacitive logic cell 901, for example a buffer cell, the input of which is coupled, for example connected, to the electrode 121 of the capacitor CR, and the output of which is coupled, for example connected, to a node for providing an output signal S of the read circuit. In the example of FIG. 10, the read circuit further comprises a fixed capacitance capacitor CL an electrode of which is coupled, for example connected, to the electrode 121 of the capacitor CR and the other electrode of which is coupled, for example connected, to an application node for applying a periodic variable power supply voltage $\phi(n)$, for example a trapezoidal voltage. In the example of FIG. 10, the cell 901 is supplied with power by a periodic variable voltage $\phi(n+1)$, for example of the same form and of the same amplitude as the voltage $\phi(n)$, but phase-shifted by $T=\tau/4$ with respect to the voltage φ(n), τ designating the period of the voltages φ(n) and φ(n+1). The output signal S is thus a periodic variable voltage in phase with the power supply voltage φ(n+1), equal to φ(n+1)*f(CR), where f(CR) is a coefficient depending on the value of the capacitance of the capacitor CR.

Various embodiments and variants have been described. Those skilled in the art will understand that certain features of these embodiments can be combined and other variants will readily occur to those skilled in the art. In particular, the described embodiments are not limited to the example bistable systems described in relation to FIGS. 2 to 7. Other mechanic, electrostatic, electrodynamic, or piezoelectric bistable systems can be used for the saving of a logic value in a memory cell of the type described in the present description.

Moreover, the described embodiments are not limited to the example embodiments of the actuating device 130 described in relation to FIGS. 1 and 8. More generally, electrode arrangements other than those described in relation to FIGS. 1 and 8 can be provided in the case of an electrostatic actuating device. Moreover, the electrostatic actuating device can be replaced by an actuating device of another type, for example an electrodynamic or piezoelectric actuating device.

Furthermore, the described embodiments are not limited to the example arrangements of the electrodes of the capacitor CR of the read device described in relation to FIGS. 1 and 8.

It should additionally be noted that the bistable systems described in relation to FIGS. 2 to 7 of the present application, and in particular the electrostatic and electrodynamic bistable systems of FIGS. 3, 6 and 7, can advantageously be used in devices other than memory cells in capacitive logic.

The invention claimed is:

1. A memory cell in capacitive logic, comprising:
a bistable system comprising a fixed element and a mobile element having two stable positions with respect to the fixed element;
read device comprising a variable-capacitance capacitor comprising a first fixed electrode and a second mobile electrode rigidly fixed to the mobile element; and
an electrically controllable write device for placing the mobile element in one or the other of its two stable positions,
wherein the bistable system is:
a) an electrostatic system comprising:
a fixed electrode and a mobile electrode, the fixed electrode comprising two conductive parts electrically connected to each other and disposed on either side of the mobile electrode;
a return spring for returning the mobile electrode to a rest position; and
a voltage application circuit for applying a direct bias voltage between the fixed electrode and the mobile electrode,
or
b) an electrodynamic system comprising:
a fixed conductive coil and a mobile element made of a ferromagnetic material disposed inside the coil;
a return spring for returning the mobile element made of a ferromagnetic material to a rest position; and
a current application circuit for applying a direct bias current between first and second ends of the coil;
wherein the bistable system is a system according to the alternative b).

2. The cell according to claim 1, wherein the write device is an electrostatic device comprising a third fixed electrode, a fourth fixed electrode, and a fifth mobile electrode rigidly fixed to the mobile element, the fifth electrode being disposed between the third and fourth electrodes.

3. The cell according to claim 2, wherein the third, fourth and fifth electrodes have the form of inter-engaged combs.

4. The cell according to claim 2, wherein the third, fourth and fifth electrodes have the form of flat plates that are parallel to one another.

5. The cell according to claim 1, wherein the first and second electrodes have the form of inter-engaged combs.

6. The cell according to claim 1, wherein the first and second electrodes have the form of flat plates that are parallel to each another.

7. A memory cell in capacitive logic, comprising:
a bistable system comprising a fixed element and a mobile element having two stable positions with respect to the fixed element;
read device comprising a variable-capacitance capacitor comprising a first fixed electrode and a second mobile electrode rigidly fixed to the mobile element; and
an electrically controllable write device for placing the mobile element in one or the other of its two stable positions,
wherein the bistable system is:
a) an electrostatic system comprising:
a fixed electrode and a mobile electrode, the fixed electrode comprising two conductive parts electrically connected to each other and disposed on either side of the mobile electrode;
a return spring for returning the mobile electrode to a rest position; and
a voltage application circuit for applying a direct bias voltage between the fixed electrode and the mobile electrode,
or
b) an electrodynamic system comprising:
a fixed conductive coil and a mobile element made of a ferromagnetic material disposed inside the coil;
a return spring for returning the mobile element made of a ferromagnetic material to a rest position; and
a current application circuit for applying a direct bias current between first and second ends of the coil;
wherein the bistable system is a system in accordance with the alternative a);
wherein the fixed electrode and the mobile electrode of the bistable system have the form of inter-engaged combs.

8. A memory cell in capacitive logic, comprising:
a bistable system comprising a fixed element and a mobile element having two stable positions with respect to the fixed element;
read device comprising a variable-capacitance capacitor comprising a first fixed electrode and a second mobile electrode rigidly fixed to the mobile element; and
an electrically controllable write device for placing the mobile element in one or the other of its two stable positions,
wherein the bistable system is:
a) an electrostatic system comprising:
a fixed electrode and a mobile electrode, the fixed electrode comprising two conductive parts electrically connected to each other and disposed on either side of the mobile electrode;

a return spring for returning the mobile electrode to a rest position; and
a voltage application circuit for applying a direct bias voltage between the fixed electrode and the mobile electrode, or b) an electrodynamic system comprising:
a fixed conductive coil and a mobile element made of a ferromagnetic material disposed inside the coil;
a return spring for returning the mobile element made of a ferromagnetic material to a rest position; and
a current application circuit for applying a direct bias current between first and second ends of the coil;
wherein the bistable system is a system in accordance with the alternative a);
wherein the fixed electrode and the mobile electrode of the bistable system have the form of flat conductive plates that are parallel to each other.

9. A memory cell in capacitive logic, comprising:
a bistable system comprising a fixed element and a mobile element having two stable positions with respect to the fixed element;
a read device comprising a variable-capacitance capacitor comprising a first fixed electrode and a second mobile electrode joined mechanically to the mobile element; and
an electrically controllable write device for placing the mobile element in one or the other of its two stable positions,
wherein the bistable system is a mechanical system, comprising a curved flexure beam coupled by its ends to a fixed frame, the ends of the beam being coupled to the fixed frame by way of springs, the bistable system further comprising an electrostatic actuating device to actuate the springs so as to move the ends of the beam further apart from each other or closer together.

* * * * *